United States Patent
Theisen et al.

(10) Patent No.: US 10,290,553 B2
(45) Date of Patent: May 14, 2019

(54) SYSTEM AND METHOD OF DETERMINING PROCESS COMPLETION OF POST HEAT TREATMENT OF A DRY ETCH PROCESS

(71) Applicant: Tokyo Electron Limited, Minato-ku, Tokyo (JP)

(72) Inventors: Jacob Theisen, Rock Tavern, NY (US); Aelan Mosden, Poughkeepsie, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/420,264

(22) Filed: Jan. 31, 2017

(65) Prior Publication Data
US 2017/0221781 A1    Aug. 3, 2017

Related U.S. Application Data

(60) Provisional application No. 62/289,476, filed on Feb. 1, 2016.

(51) Int. Cl.
*H01L 21/00* (2006.01)
*H01L 21/66* (2006.01)
(Continued)

(52) U.S. Cl.
CPC ........ *H01L 22/26* (2013.01); *H01L 21/31116* (2013.01); *H01L 21/67103* (2013.01);
(Continued)

(58) Field of Classification Search
CPC .... H01L 22/10–22/14; H01L 21/31116; H01L 21/3065–21/30655;
(Continued)

(56) References Cited

U.S. PATENT DOCUMENTS 6,183,594 B1    2/2001 Nazzal
6,716,362 B1    4/2004 Benz
(Continued)

FOREIGN PATENT DOCUMENTS

JP    2014232825 A    12/2014
KR    20080011541 A    2/2008

OTHER PUBLICATIONS

International Searching Authority, International Search Report and Written Opinion issued in related Application No. PCT/US2017/015731 dated May 31, 2017, 14 pp.

*Primary Examiner* — Kevin M Picardat
(74) *Attorney, Agent, or Firm* — Wood Herron & Evans LLP

(57) ABSTRACT

Provided is a method for determining and utilizing process completion of post heat treatment (PHT) of a dry etch process, the method comprising: providing a substrate in a process chamber, the substrate having a film layer and an underlying layer, the film layer having one or more regions; performing a dry etch process to remove the film layer or region of the film layer, the dry etch process generating a byproduct layer; measuring one or more properties of the byproduct layer; adjusting the PHT process based on the measured one or more properties of the byproduct layer; and performing the PHT process to remove the byproduct layer on the substrate; wherein the PHT process utilizes a real time in-situ process to concurrently determine when removal of the byproduct layer is complete.

18 Claims, 8 Drawing Sheets

(51) Int. Cl.
  *H01L 21/311* (2006.01)
  *H01L 21/67* (2006.01)
(52) U.S. Cl.
  CPC .. *H01L 21/67115* (2013.01); *H01L 21/67253* (2013.01); *H01L 22/12* (2013.01)
(58) Field of Classification Search
  CPC ......... H01L 21/67069; H01L 21/67103; H01L 21/67109; H01L 21/67115; H01L 21/67253
  USPC .............................................................. 438/8
  See application file for complete search history.

(56) References Cited

U.S. PATENT DOCUMENTS

| | | | |
|---|---|---|---|
| 7,126,697 B2 | 10/2006 | Usui et al. | |
| 8,048,326 B2 | 11/2011 | Yue et al. | |
| 8,175,736 B2 | 5/2012 | Tomoyasu et al. | |
| 8,257,546 B2 | 9/2012 | Davis et al. | |
| 2004/0185583 A1* | 9/2004 | Tomoyasu | C23C 16/4405 438/8 |
| 2004/0262254 A1* | 12/2004 | Ozawa | C23C 16/54 216/2 |
| 2007/0119814 A1 | 5/2007 | Patel et al. | |
| 2008/0090310 A1 | 4/2008 | Saito | |
| 2009/0017627 A1* | 1/2009 | Greeley | H01L 21/0337 438/697 |
| 2010/0163179 A1* | 7/2010 | Tozawa | H01L 21/02057 156/345.1 |
| 2010/0216296 A1* | 8/2010 | Muraki | H01L 21/02057 438/478 |
| 2012/0100641 A1* | 4/2012 | Tachibana | H01L 21/28273 438/14 |
| 2013/0193108 A1 | 8/2013 | Zheng et al. | |
| 2015/0072508 A1* | 3/2015 | Or | H01L 21/326 438/466 |
| 2015/0079801 A1 | 3/2015 | Suemasa | |
| 2016/0240385 A1* | 8/2016 | Citla | H01L 21/28035 |

* cited by examiner

SYSTEM AND METHOD OF DETERMINING PROCESS COMPLETION OF POST HEAT TREATMENT OF A DRY ETCH PROCESS

CROSS-REFERENCE TO RELATED APPLICATIONS

This application is related to and claims priority to U.S. Provisional Application No. 62/184,003, filed Jun. 24, 2015, the entire contents of which are herein incorporated by reference.

BACKGROUND OF THE INVENTION

Field of Invention

The present invention relates to a system and method for substrate processing, and more particularly to a method and system for determining the endpoint of post heat treatment (PHT) and to use endpoint data for process control.

Description of Related Art

This invention relates to dry chemical etching of thin films that require PHT. When thin films are removed using dry chemical etching a byproduct layer is left behind on the substrate's surface. Removal of this byproduct layer or film is mostly done using high temperature PHT. It would be highly advantageous to know in real time when the byproduct layer has been removed and would significantly increase process control, increase throughput, reduce defects and lead to significant yield improvements. Processes such as dry chemical etching PHT do not currently have a method to determine real time in-situ complete sublimation of etch byproduct layers.

Currently etch byproduct layer removal is done empirically where complete sublimation of the byproduct layer is estimated based on previous characterization and processing history. This 'timed' method is not real time and is therefore prone to error when taking into account film variations, process chamber conditioning, and process changes. The proposed technique is to use etch endpoint equipment and methods to determine complete etch byproduct layer removal in real time.

Advantages of this novel technique include (1) improved dry chemical etch PHT process control, (2) increase tool throughput, and (3) reduction of PHT variability.

SUMMARY OF THE INVENTION

Provided is a method for determining and utilizing process completion of PHT of a dry etch process, the method comprising: providing a substrate in a process chamber, the substrate having a film layer and an underlying layer, the film layer having one or more regions; performing one or more sequences of film layer or region removal on the substrate, the one or more sequences comprising: performing a dry etch process to remove the film layer or region of the film layer, the dry etch process generating a byproduct layer; and performing a PHT process to remove the byproduct layer on the substrate; wherein the PHT process utilizes a real time in-situ process to concurrently determine when removal of the byproduct layer is complete.

Also provided is another method for determining and utilizing process completion of PHT of a dry etch process, the method comprising: providing a substrate in a process chamber, the substrate having a film layer and an underlying layer, the film layer having one or more regions; performing a dry etch process to remove the film layer or region of the film layer, the dry etch process generating a byproduct layer; and measuring one or more properties of the byproduct layer; adjusting the PHT process based on the measured one or more properties of the byproduct layer; performing the PHT process to remove the byproduct layer on the substrate; wherein the PHT process utilizes a real time in-situ process to concurrently determine when removal of the byproduct layer is complete.

Moreover, provided is a fabrication system configured to determine and utilize process completion data of a PHT of a dry etch process for use in process control, the fabrication system comprising: a process chamber of a PHT system; a chemical oxide removal (COR) or atomic layer etch (ALE) system coupled to the PHT system; and a controller coupled to the PHT and to the COR or ALE system; wherein the COR system processes a substrate by performing a dry etch process to remove the film layer or region of the film layer, the dry etch process generating a byproduct layer; and by performing a PHT process to remove the byproduct layer on the substrate; and wherein the PHT process utilizes a real time in-situ process to concurrently determine when removal of the byproduct layer is complete. The controller also receives PHT drying completion information from the PHT system and utilizes the PHT drying completion information to adjust one or more operating variables in the PHT system in order to increase the uniformity of removal of the byproduct layer and increase substrate throughput.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

FIG. 1A depicts an exemplary schematic of a substrate in a chemical oxide removal (COR) or atomic layer etch (ALE) process at the beginning of the etch process whereas FIG. 1B depicts an exemplary schematic of a substrate at the end of an etch process whereas

DETAILED DESCRIPTION OF EMBODIMENTS OF THE INVENTION

Figure 1A:
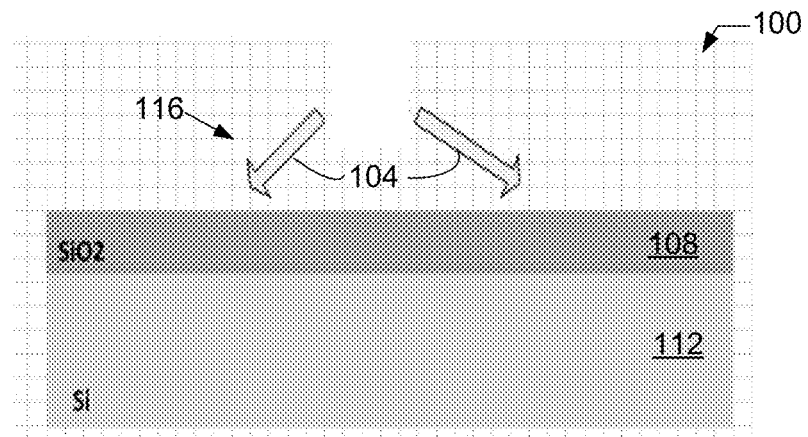

Methods and systems for determining process completion of PHT of a dry etch process are presented. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Referring now to the drawings, where like reference numerals designate identical or corresponding parts throughout the several views.

FIG. 1A depicts an exemplary schematic 100 of a substrate 116 in a chemical oxide removal (COR) or atomic layer etch (ALE) process at the beginning of the etch process. The substrate 116 includes a film layer 108 and an underlying layer 112 where the film layer 108 is typically a silicon oxide, $SiO_x$, where x is a number greater than zero. In an embodiment, the $SiO_x$ is silicon dioxide. The underlying layer 112 in one embodiment is bare silicon. The substrate 116 is exposed to etch gases 104 that etch the structure on the substrate film layer 108.

Figure 1B:
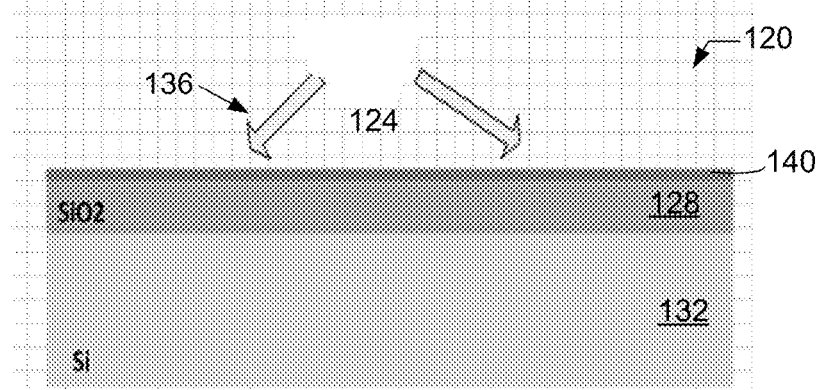

FIG. 1B depicts an exemplary schematic 120 of a substrate 136 in a chemical oxide removal (COR) or process atomic layer etch (ALE) on the film layer 128 which is typically a silicon oxide and an underlying layer 132 which is typically bare silicon. After the ALE or the COR process, a byproduct film 140 is formed which needs to be removed with a PHT process.

Figure 1C:
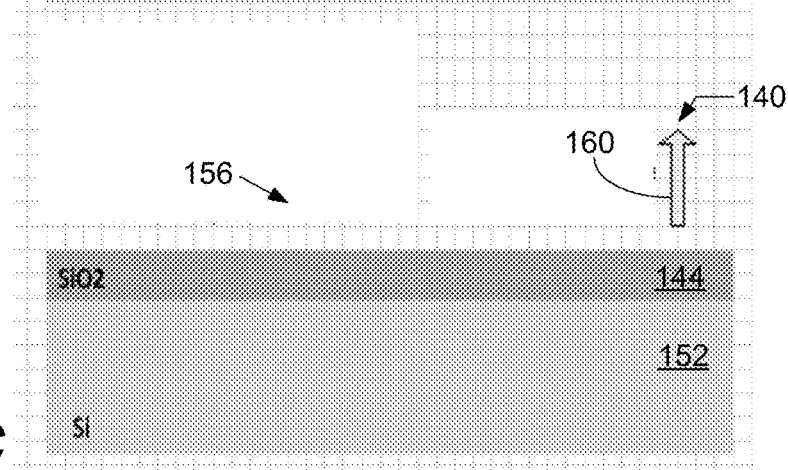
FIG. 1C depicts an exemplary schematic of a substrate at the end of the PHT process.

FIG. 1C depicts an exemplary schematic 140 of a substrate 156 in a PHT process where heat is applied to the substrate 156. After the application of heat in a predetermined temperature range and time, the byproduct film sublimates into a gas 160 leaving the film layer 144 and the underlying layer 152 of the substrate 156.

Figure 2:
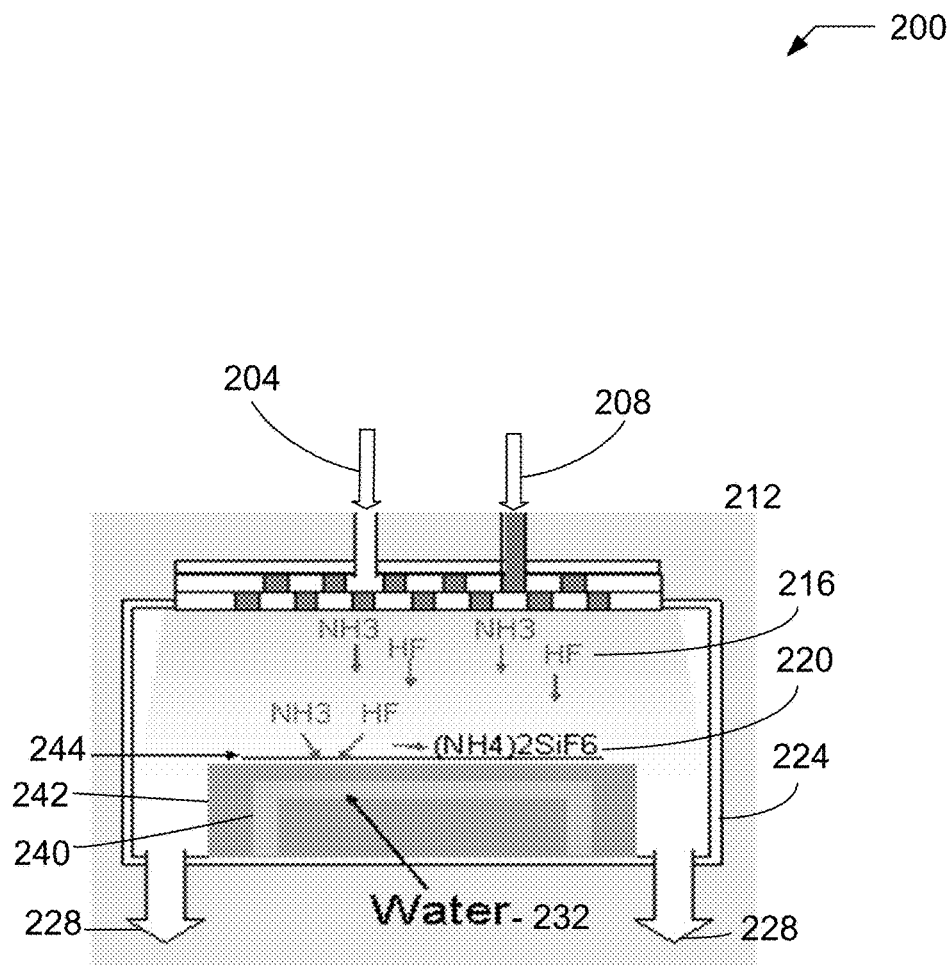
FIG. 2 depicts a schematic of a substrate in a COR or ALE process in an embodiment of the present invention.

FIG. 2 depicts a schematic 200 of etch processing system in an embodiment of the present invention. As mentioned above, the etch process can be an ALE or a COR. In one embodiment, the etch processing is COR utilizing ammonia 204 and hydrofluoric acid gas 208 which are used to etch a layer of the substrate 244. The ammonia 204 and the hydrofluoric acid gases 208 mix in the gas distribution system 212 forming a plasma 216 in the process chamber 224 and exposes the substrate 244 to the etch gases. The plasma 216 is disposed of in the etch gas exits 228. The temperature of the process chamber 224 is in the range from 50 to 275 degrees Centigrade or a range from 200 to 400 degrees Centigrade. Water 232 is circulated through a delivery system 240 in the chuck 242 to control the temperature of the reaction chamber 224. In the case when ammonia and hydrofluoric acid gas are used, a byproduct layer 220, ammonium fluorosilicate, is created on top the substrate 244. The chemical reactions in the COR process include:

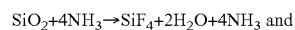

$SiO_2 + 4NH_3 \rightarrow SiF_4 + 2H_2O + 4NH_3$ and

$SiF_4 + 2HF + 2NH_3 \rightarrow (NH_4)_2SIF_6$.

In another embodiment, the etch process can be an ALE creating a byproduct layer that would also be removed using the PHT process.

Figure 3:
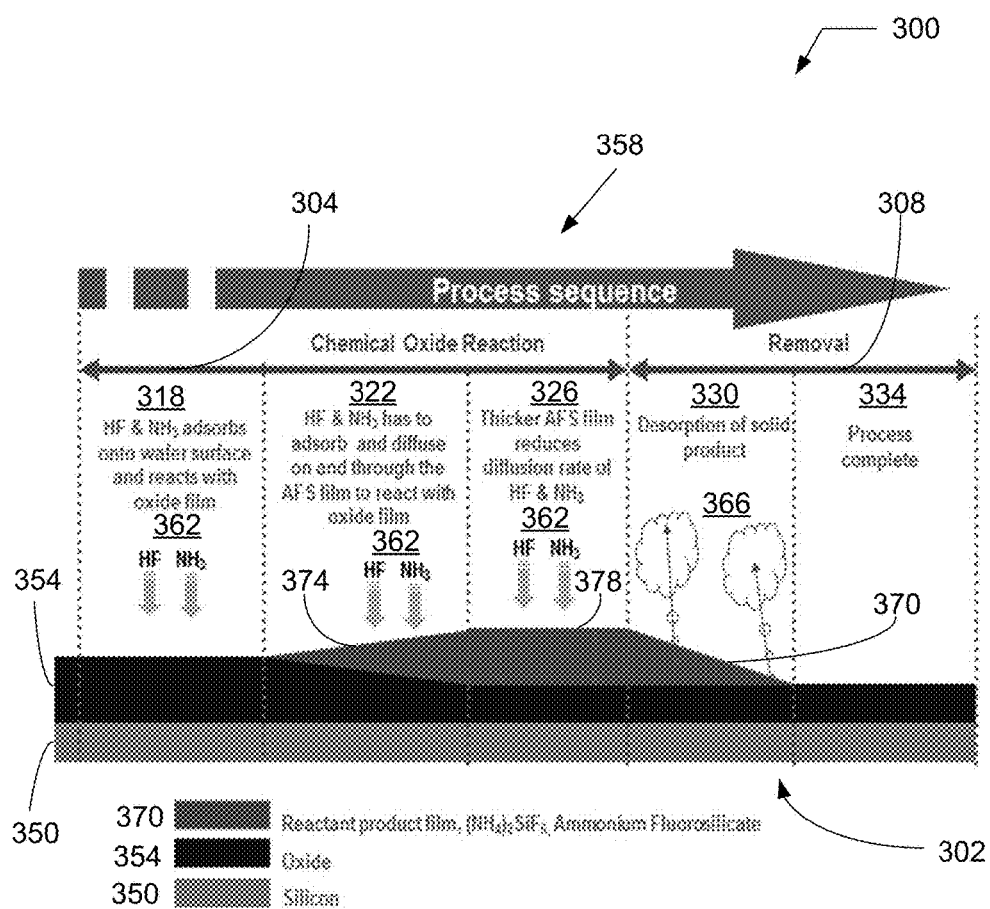
FIG. 3 depicts a schematic of a substrate in a COR or ALE and a PHT process in an embodiment of the present invention.

FIG. 3 depicts a schematic 300 of a COR and a PHT integration scheme in an embodiment of the present invention. The process sequence 358 depict the varying composition of the substrate 302 comprising reactant product film 370 also referred to as the byproduct layer, the oxide 354, and the silicon 350. The process sequence 358 includes five stages, the first three stages 304 involving stages of a COR or ALE, and the last two stages 308 involving stages of a PHT process. In an embodiment where the etch gases include ammonia and hydrofluoric acid gas 362, the reactant product film or byproduct layer is ammonium fluorosilicate (AFS) 370. The stages are: (1) the first stage 318 depicting adsorption and reaction of etch gases 362 on the substrate surface, (2) the second stage 322 depicting diffusion through the ammonium fluorosilicate (AFS) film and reaction of the etch gases 362 with the oxide film 354, (3) the third stage 326 depicting a thick AFS film 370 that reduces diffusion rate of the etch gases 362, (4) the fourth stage 330 depicting desorption 366 of the AFS solid byproduct 370, and (5) the fifth stage 334 depicting PHT complete with the AFS solid byproduct completely removed.

Figure 4A:
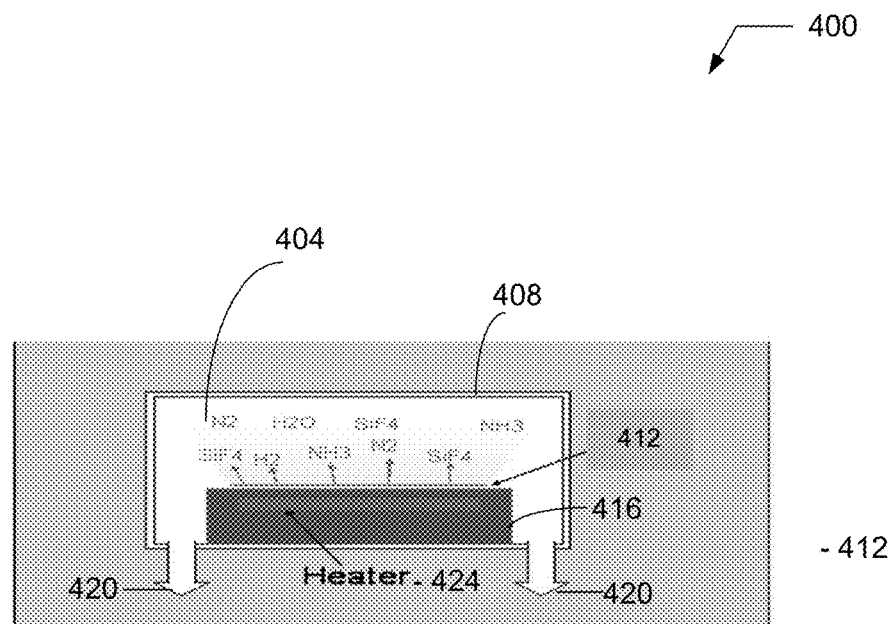
FIG. 4A depicts a schematic of a PHT process in an embodiment of the present invention.

FIG. 4A depicts a schematic 400 of a PHT in an embodiment of the present invention. The post heating treatment (PHT) heats up the process chamber 408 with a heater 424 that is disposed in proximity to the substrate which can be heated to a range 50 to 275 degree C., or to a range of 120 to 180 degree C. This causes the AFS solid byproduct layer (not shown) of the substrate 412 to sublimate into the upper portion 404 and the vapors are removed using gas exits 420. The heater 424 can be integrated with the chuck 416 or disposed in a different position in the process chamber 408. The heater 424 can comprise one or more of a heated stage with cooling capability, an electric heater, arc lamp, and/or halogen lamp. Heating the substrate 412 causes desorption of the AFS solid byproduct layer to gases as shown in the chemical reaction:

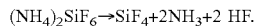

Figure 4B:
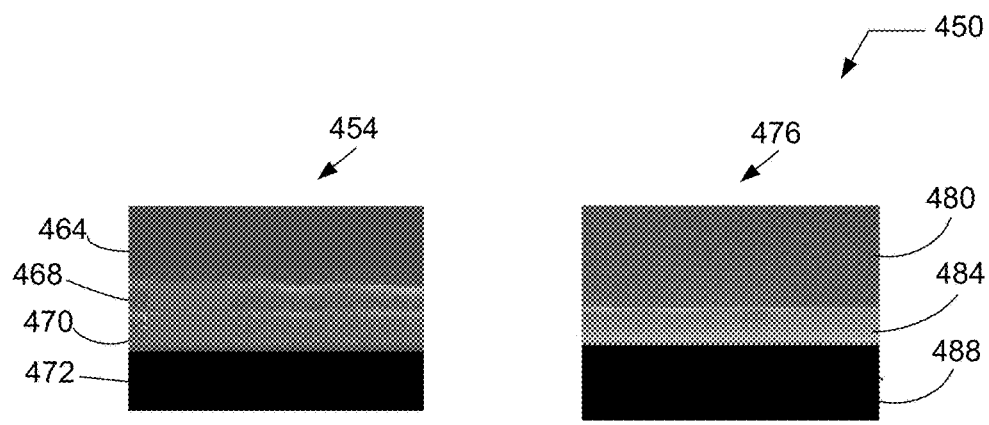
FIG. 4B depicts images of a side-view of the substrate layers before and after the PHT process in an embodiment of the present invention.

FIG. 4B depicts images 450 of a side-view of the substrate layers before the PHT process (image 454) and after the PHT process (image 476) in an embodiment of the present invention. The underlying layers of the substrate include a silicon oxide layer in corresponding images 470, 484 on top of a silicon layer in corresponding images 472, 488. The AFS solid byproduct 468 as shown in image 454 is approximately 50.0 nm. After endpoint of the PHT is reached as shown in image 476, the $SiO_2$ layer 488 shows that the AFS solid byproduct has sublimated completely.

Figure 5A:
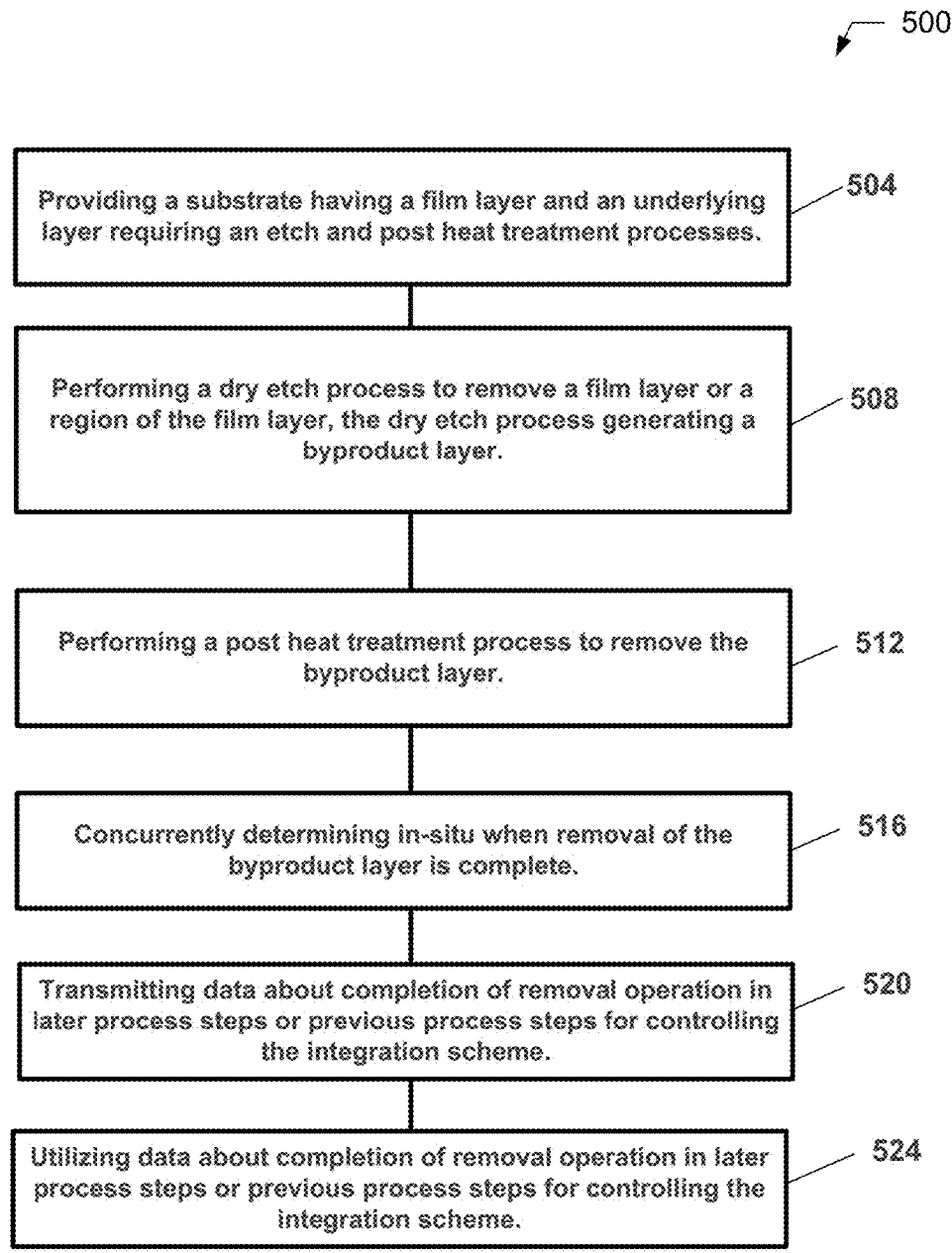
FIG. 5A is an exemplary process flow chart of the method of performing an integration process for a substrate requiring an etch and a PHT process in an embodiment of the present invention.

FIG. 5A is an exemplary process flow chart 500 of the method of performing an integration process for a substrate requiring an etch and a PHT process in an embodiment of the present invention. In operation 504, a substrate having a film layer and an underlying film layer requiring an etch and PHT processes is provided. The etch process can be a chemical oxide removal or an atomic layer etch process. In operation 508, a dry etch process is performed to remove the film layer or a portion of the film layer, the dry etch process generating a byproduct layer. In operation 512, a PHT process is performed to remove the byproduct layer. In operation 516, completion of the removal of the byproduct layer is determined in situ concurrent to the PHT process. In operation 520, completion data of byproduct layer removal operation is transmitted to previous process steps or later process steps in order to control the etch and PHT processes. In operation 524, completion data of the byproduct removal operation is used in previous process operations or later process operations for process control of the integration scheme.

The PHT process can include the use of energy sources including a laser source, an electrical source, or radio frequency source, and/or a microwave source for generating heat. The PHT process can be performed at a temperature range from 50 to 275 degrees C.; pressure in the process chamber can be in a range from 50 mTorr to 3,000 mTorr; the thickness of the byproduct layer can be from 1 to 500 Angstroms. Measurement of one or more properties of the byproduct layer can be performed using a broadband metrology tool such as a reflectometer, an ellipsometer or a spectrometer or a laser metrology tool or gas analysis such as a residual gas analysis (RGA).

There is a lag time from completion of byproduct layer removal until termination of the PHT process, referred to as PHT lag time. In an embodiment, the lag time from completion of byproduct removal until termination of the PHT process is in a range from 1 to 25 seconds or 30 seconds or less. Other operating variables of the etch process and PHT process include ion current, gas components such as the ammonia, hydrofluoric acid gas partial pressure, etch time of the COR or ALE process, PHT sublimation time, PHT temperature, PHT pressure, and PHT lag time.

Removal process objectives can include meeting a PHT lag time target, PHT sublimation time target, etch time target, PHT tool throughput target, and/or byproduct removal target as a percentage. For example, the PHT lag time target can be in a range from 1 to 15 seconds or less and a byproduct layer removal target can be in a range from 80 to 100%.

Figure 5B:
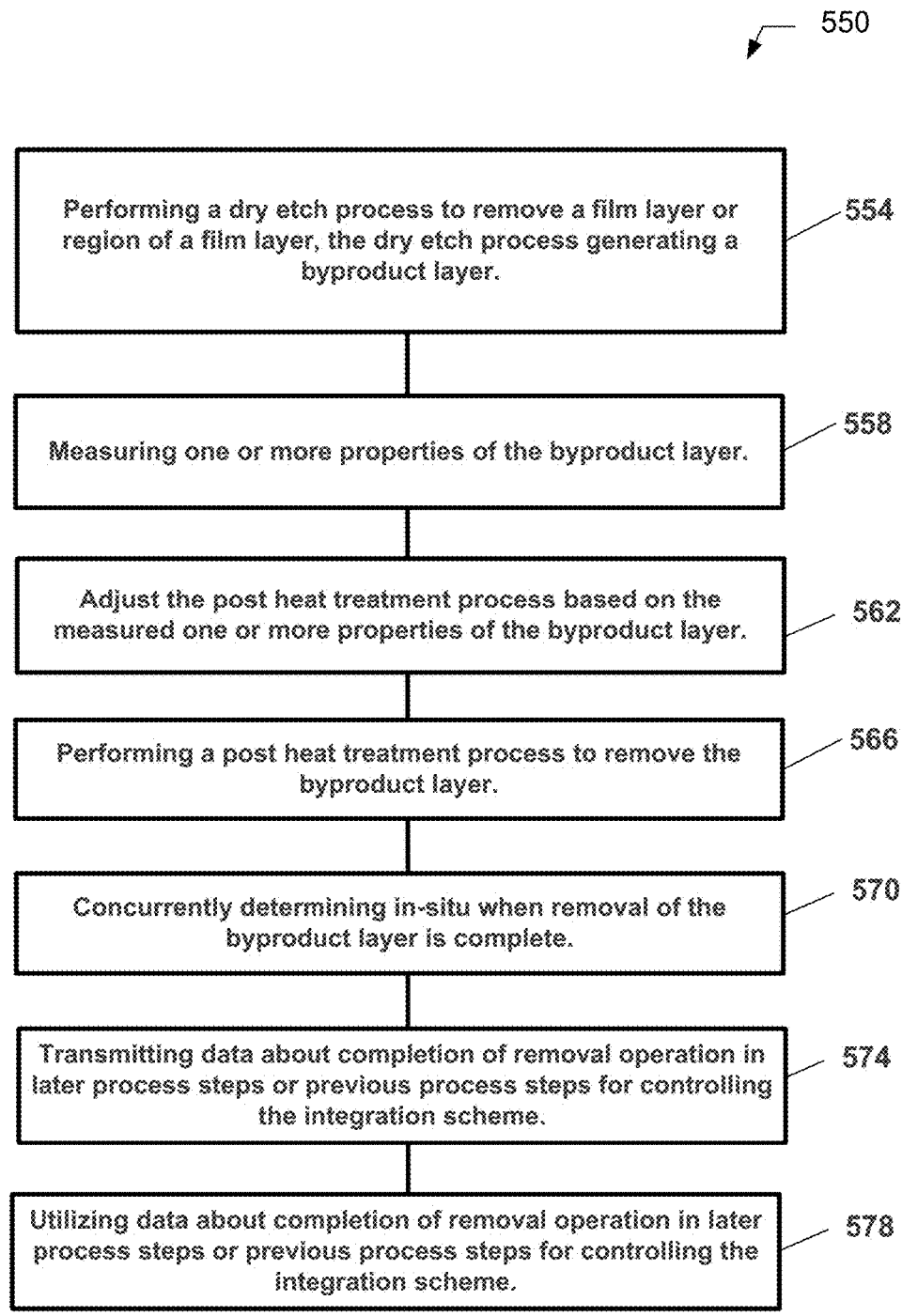
FIG. 5B is an exemplary process flow chart of the method of performing an integration process for a substrate requiring an etch and a PHT process with data utilization for integration process control in an embodiment of the present invention.

FIG. 5B is an exemplary process flow chart 550 of the method of performing an integration process for a substrate that require an etch and a PHT wherein endpoint PHT data is utilized for process control of the integration scheme in an embodiment of the present invention. In operation 554, a dry etch process is performed to remove a film layer or region of a film layer of a substrate, the dry etch process generating a byproduct layer. As mentioned above, the dry etch process can be a chemical oxide removal (COR) or an atomic layer etch (ALE) process. In operation 558, one or more properties of the byproduct layer is measured. The one or more properties can include a thickness or thickness distribution of the byproduct layer or portion of the substrate covered by the byproduct layer. In one embodiment, the dry etch process is a COR, the gas mixture used to etch the layer of the substrate comprises ammonia and hydrofluoric acid gas, and the byproduct layer is AFS. In operation 562, the PHT process is adjusted based on the measured one or more properties of the byproduct layer. For example, if the thickness of the byproduct layer is in the higher end of the range, two or more heating devices may be turned on in the PHT process. Alternatively, the setting of the one or more heating devices may be set for a higher temperature range. If the thickness of the byproduct layer is in the lower end of the range, only one heating device may be turned on in the PHT process, or alternatively, the heating devices may be set for a lower temperature range.

In operation 566, a PHT process is performed to remove the byproduct layer. In operation 570, completion of the removal of the byproduct layer is determined in situ concurrent to the PHT process. In operation 574, completion data of removal operation is transmitted to previous process steps or later process steps in order to control the etch and PHT processes. In operation 578, completion data of the byproduct removal operation is used in previous process steps or later process steps for process control of the integration scheme. As mentioned above, the PHT process can include the use of energy sources including a laser source, a plasma source, an electrical source, or radio frequency source, and/or a microwave source for generating heat. The PHT process can be performed at a temperature range from 50 to 275 degrees C.; pressure in the process chamber can be in a range from 50 mTorr to 3,000 mTorr; the thickness of the byproduct layer can be from 1 to 500 Angstroms. Measurement of one or more properties of the byproduct layer can be performed using a broadband metrology tool such as a reflectometer, an ellipsometer or a spectrometer or a laser metrology tool or gas analysis such as a residual gas analysis (RGA).

The inventors found that the heating time in the PHT process was reduced and the sublimation of the byproduct layer was more uniform and was set at an optimum temperature. The substrate throughput also increased, resulting in a reduction of the cost of ownership.

Figure 6:
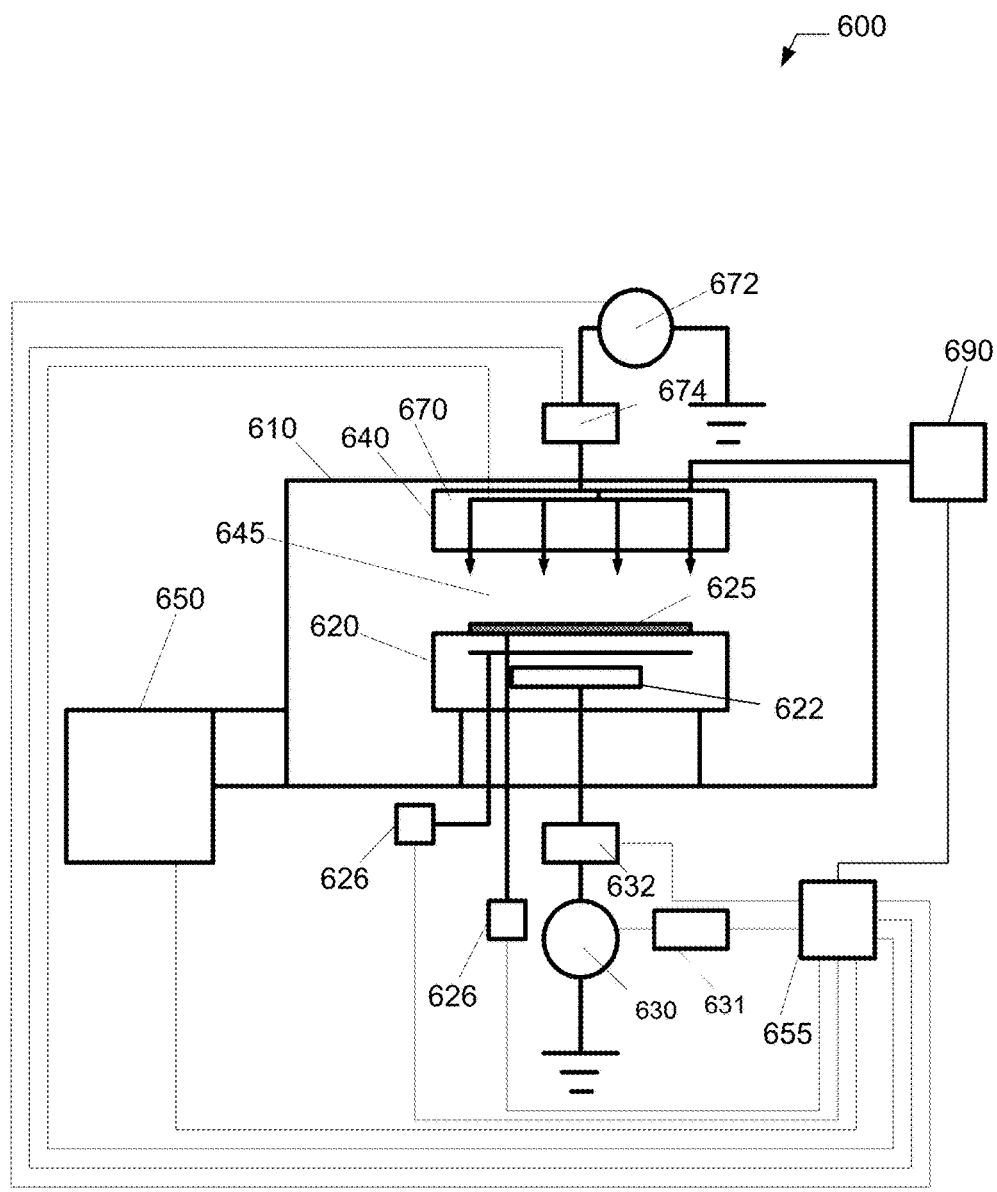
FIG. 6 is an exemplary systems chart for performing an etch and PHT in an embodiment of the present invention.

FIG. 6 is an exemplary systems chart 600 for performing an etch and PHT in an embodiment of the present invention. An etch and PHT system 600 configured to perform the above identified process conditions is depicted in FIG. 6 comprising a processing chamber 610, substrate holder 620, upon which a substrate 625 to be processed is affixed, and vacuum pumping system 650. Substrate 625 can be a semiconductor substrate, a wafer, a flat panel display, or a liquid crystal display. Processing chamber 610 can be configured to facilitate etching the processing region 645 in the vicinity of a surface of substrate 625. An ionizable gas or mixture of process gases is introduced via a gas distribution system 640. For a given flow of process gas, the process pressure is adjusted using the vacuum pumping system 650. The processing can aid the removal of material from the exposed surfaces of substrate 625. The etch processing system 600 can be configured to process substrates of any desired size, such as 200 mm substrates, 300 mm substrates, or larger.

Substrate 625 can be affixed to the substrate holder 620 via a clamping system 628, such as a mechanical clamping system or an electrical clamping system (e.g., an electrostatic clamping system). Furthermore, substrate holder 620 can include a heating system (not shown) or a cooling system (not shown) that is configured to adjust and/or control the temperature of substrate holder 620 and substrate 625. The heating system or cooling system may comprise a re-circulating flow of heat transfer fluid that receives heat from substrate holder 620 and transfers heat to a heat exchanger system (not shown) when cooling, or transfers heat from the heat exchanger system to substrate holder 620 when heating. In other embodiments, heating/cooling elements, such as resistive heating elements, or thermo-electric heaters/coolers can be included in the substrate holder 620, as well as the chamber wall of the processing chamber 610 and any other component within the processing system 600.

Additionally, a heat transfer gas can be delivered to the backside of substrate 625 via a backside gas supply system 626 in order to improve the gas-gap thermal conductance between substrate 825 and substrate holder 620. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 625.

In the embodiment shown in FIG. 6, substrate holder 620 can comprise an electrode 622 through which RF power is coupled to the processing region 645. For example, substrate holder 620 can be electrically biased at a RF voltage via the transmission of RF power from a RF generator 630 through an optional impedance match network 632 to substrate holder 620. The RF electrical bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 80 MHz. RF systems for plasma processing are well known to those skilled in the art.

Furthermore, the electrical bias of electrode 622 at a RF voltage may be pulsed using pulsed bias signal controller 631. The RF power output from the RF generator 630 may be pulsed between an off-state and an on-state, for example. Alternately, RF power is applied to the substrate holder electrode at multiple frequencies. Furthermore, impedance match network 632 can improve the transfer of RF power to plasma in plasma processing chamber 610 by reducing the reflected power. Match network topologies (e.g. L-type, π-type, T-type, etc.) and automatic control methods are well known to those skilled in the art.

Gas distribution system 640 may comprise a showerhead design for introducing a mixture of process gases. Alternatively, gas distribution system 640 may comprise a multi-zone showerhead design for introducing a mixture of process gases and adjusting the distribution of the mixture of process gases above substrate 625. For example, the multi-zone showerhead design may be configured to adjust the process gas flow or composition to a substantially peripheral region above substrate 625 relative to the amount of process gas flow or composition to a substantially central region above substrate 625.

Vacuum pumping system 650 can include a turbo-molecular vacuum pump (TMP) capable of a pumping speed up to about 8000 liters per second (and greater) and a gate valve for throttling the chamber pressure. In conventional plasma processing devices utilized for dry plasma etching, an 800 to 3000 liter per second TMP can be employed. TMPs are useful for low pressure processing, typically less than about 50 mTorr. For high pressure processing (i.e., greater than about 80 mTorr), a mechanical booster pump and dry roughing pump can be used. Furthermore, a device for monitoring chamber pressure (not shown) can be coupled to the plasma processing chamber 610.

As mentioned above, the controller 655 can comprise a microprocessor, memory, and a digital I/O port capable of generating control voltages sufficient to communicate and activate inputs to processing system 600 as well as monitor outputs from plasma processing system 600. Moreover, controller 655 can be coupled to and can exchange information with RF generator 830, pulsed bias signal controller 631, impedance match network 632, the gas distribution system 640, vacuum pumping system 650, as well as the substrate heating/cooling system (not shown), the backside gas supply system 626, and/or the electrostatic clamping system 628. For example, a program stored in the memory can be utilized to activate the inputs to the aforementioned components of processing system 600 according to a process recipe in order to perform a plasma assisted process, such as a plasma etch process or a PHT process, on substrate 625.

In addition, the processing system 600 can further comprise an upper electrode 670 to which RF power can be coupled from RF generator 672 through optional impedance match network 674. A frequency for the application of RF power to the upper electrode can range from about 0.1 MHz to about 200 MHz. Additionally, a frequency for the application of power to the lower electrode can range from about 0.1 MHz to about 80 MHz. Moreover, controller 655 is coupled to RF generator 672 and impedance match network 674 in order to control the application of RF power to upper electrode 670. The design and implementation of an upper electrode is well known to those skilled in the art. The upper electrode 670 and the gas distribution system 640 can be designed within the same chamber assembly, as shown. Alternatively, upper electrode 670 may comprise a multi-zone electrode design for adjusting the RF power distribution coupled to plasma above substrate 625. For example, the upper electrode 670 may be segmented into a center electrode and an edge electrode.

Depending on the applications, additional devices such as sensors or metrology devices can be coupled to the processing chamber 610 and to the controller 655 to collect real time data and use such real time data to concurrently control two or more selected integration operating variables in two or more steps involving deposition processes, RIE processes, pull processes, profile reformation processes, heating treatment processes and/or pattern transfer processes of the integration scheme. Furthermore, the same data can be used to ensure integration targets including completion of PHT, patterning uniformity (uniformity), pulldown of structures (pulldown), slimming of structures (slimming), aspect ratio of structures (aspect ratio), line width roughness, substrate throughput, cost of ownership, and the like are achieved.

Figure 7:
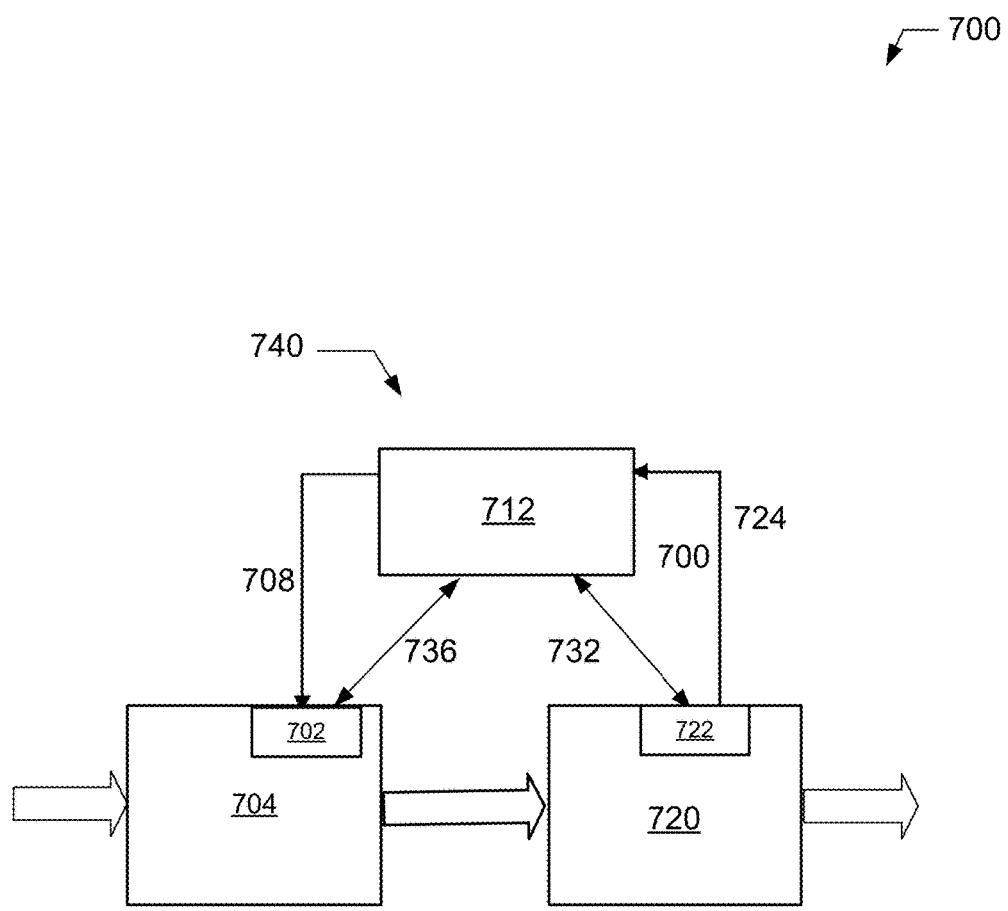
FIG. 7 is an exemplary systems chart depicting a controller of an integration system processing metrology data to facilitate process control of operations and achieve integration objectives.

FIG. 7 is an exemplary systems chart 700 depicting a controller 712 of an integration system 740 processing and transmitting data between systems in order to facilitate process control of operations and achieve integration objectives. The controller 712 is coupled to the etch process system 704, the PHT process system 720, and to other systems (not shown) upstream or downstream of the integration system 740. The etch process system 704 includes in situ online metrology devices 702 and the PHT process system 720 includes in situ online metrology devices 722 that collect metrology data that are used to determine completion of the COR or ALE process and the PHT process. In an embodiment, the same process chamber can be used as the etch process system 704 and as the PHT process system 720. As discussed in connection with FIG. 5B, operation 558, the in situ online metrology devices 722 can make one or more measurement of the byproduct layer. For example, the thickness of the byproduct layer can be measured and the PHT process can be adjusted based on the measured one or more properties of the byproduct layer, using data transmission routes 708, 736, 733, and 724, utilizing the computer capabilities of the controller 712. As discussed above, if the thickness of the byproduct layer is in the higher end of the range, two more heating devices may be turned on in the PHT process. Alternatively, the setting of the one or more heating devices may be set for a higher temperature range. If the thickness of the byproduct layer is in the lower end of the range, only one heating device may be turned on in the PHT process, or alternatively, the heating devices may be set for a lower temperature range. Furthermore, based on the completion data about the PHT process, instructions to terminate the PHT process can be sent using the controller 712.

Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What we claim:

1. A method for determining and utilizing process completion of post heat treatment (PHT) of a dry etch process, the method comprising:
   providing a substrate in a process chamber, the substrate having a film layer and an underlying layer, the film layer having one or more regions;
   performing one or more sequences of film layer or region removal on the substrate, the one or more sequences comprising:
      performing a dry etch process to remove the film layer or region of the film layer, the dry etch process generating a byproduct layer; and
      performing a PHT process to remove the byproduct layer on the substrate;
   wherein the PHT process utilizes a real time in-situ process to concurrently determine when removal of the byproduct layer is complete, and
   wherein measurement of the byproduct layer thickness is performed using a laser metrology tool, a reflectometer, an ellipsometer or a spectrometer; wherein the real time in-situ process of determining completeness of the PHT process utilizes measurement of a composition of a gaseous product of the PHT process; or wherein the real time in-situ process of determining completeness of the PHT process utilizes residual gas analysis (RGA).

2. The method of claim 1 wherein the dry etch process is a chemical oxide removal or an atomic layer etch process.

3. The method of claim 2 wherein the performing the dry etch process utilizes a real time in-situ process to concurrently determine when the dry etch process is complete.

4. The method of claim 3 wherein, for generating heat, the PHT process includes the use of at least one of a heated stage with cooling capability, electric heaters, and/or halogen lamps, a laser source, a plasma source, or a radio frequency (RF).

5. The method of claim 4 wherein the performing one or more sequences includes at least one of: performing the PHT process at a temperature in a range of 50 to 275 degrees C.; a pressure in the process chamber being in a range from 50 to 3,000 mTorr; or a thickness of the byproduct layer generated by the dry etch process being in the range from 1 to 500 Angstroms.

6. The method of claim 1 wherein the dry etch process is a chemical oxide removal (COR) and uses at least one of a fluorine gas, hydrogen fluoride gas, ammonia as a purge gas, or one or more noble gases as the purge gas.

7. The method of claim 6 wherein a lag time from completion of byproduct layer removal until termination of the PHT process is less than 30 seconds or is in a range from 1 to 25 seconds.

8. The method of claim 7 further comprising adjusting one or more operating variables of the etch process and the PHT process, wherein the operating variables of the etch process and the PHT process include at least one of an ion current, a gas component partial pressure, an etch time, a PHT sublimation time, a PHT temperature, a PHT pressure, or a PHT lag time.

9. The method of claim 8 further comprising meeting one or more removal process objectives, wherein the removal process objectives include at least one of a PHT lag time target that is in a range from 1 to 15 seconds or less, a PHT sublimation time target, an etch time target, a PHT tool throughput target, or a byproduct layer removal target that is in a range from 80 to 100%.

10. A method for determining and utilizing process completion of post heat treatment (PHT) of a dry etch process, the method comprising:
   providing a substrate in a process chamber, the substrate having a film layer and an underlying layer, the film layer having one or more regions;
   performing one or more sequences of film layer or region removal on the substrate, the one or more sequences comprising:
      performing a dry etch process to remove the film layer or region of the film layer, the dry etch process generating a byproduct layer; and
      performing a PHT process to remove the byproduct layer on the substrate;

wherein the PHT process utilizes a real time in-situ process to concurrently determine when removal of the byproduct layer is complete,
  wherein performing the PHT process further comprises:
    measuring one or more properties of the byproduct layer; and
    adjusting the PHT process based on the measured one or more properties of the byproduct layer.

11. The method of claim 10 wherein measuring one or more properties of the byproduct layer includes using one or more in situ online metrology devices selected from a laser metrology tool, a reflectometer, an ellipsometer or a spectrometer, the one or more in situ devices coupled to the process chamber and to a controller, and wherein the controller is used to perform the adjusting before and/or during the PHT process.

12. The method of claim 11 wherein the measuring includes measuring the thickness of the byproduct layer, and wherein the adjusting includes adjusting the number of heating devices set to an on position and/or adjusting the temperature of the heating devices set to an on position.

13. The method of claim 11 wherein a lag time from completion of byproduct layer removal until termination of the PHT process in response to the instruction from the controller is less than 15 seconds.

14. A method for determining and utilizing process completion of post heat treatment (PHT) of a dry etch process, the method comprising:
  providing a substrate in a process chamber, the substrate having a film layer and an underlying layer, the film layer having one or more regions;
  performing one or more sequences of film layer or region removal on the substrate, the one or more sequences comprising:
    performing a dry etch process to remove the film layer or region of the film layer, the dry etch process generating a byproduct layer; and
    performing a PHT process to remove the byproduct layer on the substrate;
wherein the PHT process utilizes a real time in-situ process to concurrently determine when removal of the byproduct layer is complete,
  wherein the real time in-situ process of determining completeness of the PHT process utilizes measurement of a composition of a gaseous product of the PHT process; or the real time in-situ process of determining completeness of PHT process utilizes residual gas analysis (RGA).

15. A fabrication system configured to determine and utilize process completion data of a post heat treatment (PHT) of a dry etch process for use in process control, the fabrication system comprising:
  a process chamber of a PHT system;
  a chemical oxide removal (COR) system coupled to the PHT system;
  a controller coupled to the PHT system and to the COR system; and
  a fabrication sub-system comprising one or more of a deposition system, a plasma etch system, a dry etch system, a wet etch system, a cleaning system, an annealing system, or a doping system, the fabrication system coupled to the controller, the COR system, and the PHT system;
  wherein the COR system processes a substrate by performing a dry etch process to remove a film layer on the substrate or region of the film layer, the dry etch process generating a byproduct layer; and wherein the PHT system processes the substrate by performing a PHT process to remove the byproduct layer on the substrate; and
  wherein the PHT process utilizes a real time in-situ process to concurrently determine when removal of the byproduct layer is complete, the real time in-situ process including one or more in-situ online metrology devices to collect metrology data.

16. A method for determining and utilizing process completion of post heat treatment (PHT) of a dry etch process, the method comprising:
  providing a substrate in a process chamber, the substrate having a film layer and an underlying layer, the film layer having one or more regions;
  performing one or more sequences of film layer or region removal on the substrate, the one or more sequences comprising:
    performing a dry etch process to remove the film layer or region of the film layer, the dry etch process generating a byproduct layer; and
    performing a PHT process to remove the byproduct layer on the substrate;
wherein the PHT process utilizes a real time in-situ process to concurrently determine when removal of the byproduct layer is complete,
  wherein the real time in-situ process comprises using one or more in situ online metrology devices to collect metrology data.

17. The method of claim 16 wherein the one or more in situ online metrology devices are coupled to the process chamber and to a controller, the real time in-situ process further comprising using the metrology data to determine when removal of the byproduct layer is complete, and using the controller to send instructions to terminate the PHT process when it is determined that removal of the byproduct layer is complete.

18. The method of claim 16 wherein the one or more in situ online metrology devices are selected from a laser metrology tool, a reflectometer, an ellipsometer or a spectrometer.

* * * * *